United States Patent [19]

Zarabadi et al.

[11] Patent Number: 5,317,279
[45] Date of Patent: May 31, 1994

[54] LINEAR VOLTAGE TO CURRENT CONVERTER INCLUDING FEEDBACK NETWORK

[75] Inventors: Seyed R. Zarabadi, Kokomo, Ind.; Mohammed Ismail, Columbus, Ohio

[73] Assignee: Ohio State University, Columbus, Ohio

[21] Appl. No.: 999,316

[22] Filed: Dec. 31, 1992

[51] Int. Cl.$^5$ .............................................. H03F 3/45
[52] U.S. Cl. ..................................... 330/253; 330/257
[58] Field of Search ................. 330/253, 257, 260, 300

[56] References Cited

U.S. PATENT DOCUMENTS 4,580,106  4/1986  Vittoz .................................. 330/261
5,146,179  9/1992  Carley et al. ........................ 330/253

FOREIGN PATENT DOCUMENTS 0124609  5/1990  Japan .................................. 330/257

OTHER PUBLICATIONS

*High Frequency CMOS Transconductors, Analogue IC Design: The Current-Mode Approach*, (Chp. 5), Dupuie and Ismail, edited by Ioumazou, Lidgey & Haigh, 1990 (Peter Peregrinus Ltd.).
*Integrated Circuits and Microprocessors*, Electronics Engineers' Handbook, (3d Ed.) edited by Fink and Christiansen, pp. 8-64-8-66; *Operational Amplifiers for Analog Arithmetic*, Hesler, pp. 13-96-13-99, 1989, McGraw-Hill, Inc.
Electronics Engineers' Handbook, (3d Ed.) edited by Fink and Christiansen, "Integrated Circuits and Microprocessors", pp. 8-64-8-66; "Operational Amplifiers for Analog Arithmetic", by Hesler, pp. 13-96-13-99, 1989.
Babanezhad and Temes, "A 20-V Four-Quadrant CMOS Analog Multiplier", IEEE Journal of Solid State Circuits, vol. SC-20, No. 6, pp. 1158-1167, Dec., 1985.
Torrance, Viswanathan, and Hanson, "CMOS Voltage to Current Transducers", IEEE Transactions on Circuits and Systems, vol. CAS-32, No. 11, pp. 1097-1104, Nov., 1985.

*Primary Examiner*—James B. Mullins
*Assistant Examiner*—J. Dudek
*Attorney, Agent, or Firm*—Bell, Seltzer, Park & Gibson

[57] ABSTRACT

A voltage to current converter includes three field effect transistors (FETs), the sources of which are electrically connected to define a common source node, and a feedback network. First and second voltage inputs are connected to the gates of the first and second FETs, respectively. First and second current outputs are connected to the drains of the first and second FETs, respectively. The feedback network is connected between the drain of the third FET and the common source node. The feedback network controls and extends linearity by varying the voltage between the common source node and ground in response to changes in the voltage inputs in order to maintain a constant current through the third FET. The floating common source node quickly adjusts and thereby keeps a linear relationship between the input voltages and the output currents. Thus, the feedback network can dynamically bias the converter by permitting the common source node to float with respect to ground.

32 Claims, 13 Drawing Sheets

LINEAR VOLTAGE TO CURRENT CONVERTER INCLUDING FEEDBACK NETWORK

FIELD OF THE INVENTION

This invention relates to the field of signal processing circuits, and more particularly to voltage to current converters.

BACKGROUND OF THE INVENTION

Voltage to current converters are well known electronic building blocks for many circuit applications. As is well known to those having skill in the art, a voltage to current converter, also known as a transconductor, provides an output current that is directly proportional to an input voltage and which is independent of the load impedance. Voltage to current converters are widely used where it is necessary to generate a current signal in proportion to a given voltage signal.

For example, voltage to current converters are used in signal processors. The performance of signal processors is dependent on interface circuits such as voltage to current and current to voltage converters. In addition, analog four quadrant multipliers, using voltage to current converters, play important roles in the construction of convolvers, correlators, adaptive filters, and complex analog signal processors. Other computational circuits that use a voltage to current converter as part of their structure include multipliers, dividers, squaring circuits, integrators, and difference of squares circuits.

As technology advances, there exists a need for faster and more linear devices. As system speeds increase, voltage to current converter speed must also increase, so that the voltage to current converter does not produce a bottleneck in a system. Moreover, as system accuracy requirements increase, greater linearity demands are placed on the voltage to current converter. Finally, many systems are capable of processing both balanced and unbalanced inputs. Accordingly, there is a need for a voltage to current converter which is capable of receiving both balanced and unbalanced inputs.

SUMMARY OF THE INVENTION

It is therefore an object of the present invention to provide an improved high speed linear voltage to current converter.

It is another object of the present invention to provide a voltage to current converter which is capable of receiving both balanced and unbalanced inputs.

It is yet another object of the invention to provide a voltage to current converter that can be used as a building block for other circuits.

These and other objects according to the present invention are provided by a voltage to current converter which includes three field effect transistors (FETs), the sources of which are electrically connected to define a common source node, and a feedback network. First and second balanced voltage inputs are connected to the gates of the first and second FETs, respectively. First and second current outputs are connected to the drains of the first and second FETs, respectively. The feedback network is connected between the drain of the third FET and the common source node for maintaining constant current through the third FET. The feedback network varies the voltage between the common source node and ground in response to changes in the voltage inputs in order to maintain a constant current through the third FET.

A second embodiment of the invention, capable of accepting unbalanced inputs, includes four FETs and two feedback networks. The sources of the first and second FETs are connected together to define a first common source node. The sources of the third and fourth FETs are connected together to define a second common source node. A first voltage input is connected to the gates of the first and third FETs. A second voltage input is connected to the gates of the second and fourth FETs. A first and second current output is connected to the drains of the third and second FETs, respectively. A first feedback network is connected between the drain of the first FET and the first common source node for maintaining constant current through the first FET. A second feedback network is connected between the drain of the fourth FET and the second common source node for maintaining constant current through the fourth FET.

A voltage to current converter controls and extends its linearity by varying the voltage of the common source node to ground in response to changes in the voltage inputs. Thus, the feedback networks of the present invention dynamically bias their respective converters by permitting the common source nodes to float with respect to ground. The floating common source nodes quickly adjust and thereby keep constant a linear current output. A high performance converter is thus produced.

DESCRIPTION OF THE PREFERRED EMBODIMENTS

The present invention will now be described more fully hereinafter with reference to the accompanying drawings, in which two preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements in alternate embodiments throughout. Subscripts a or b signify where the components of FIG. 4 perform analogous functions to the components of FIG. 1.

Figure 1:
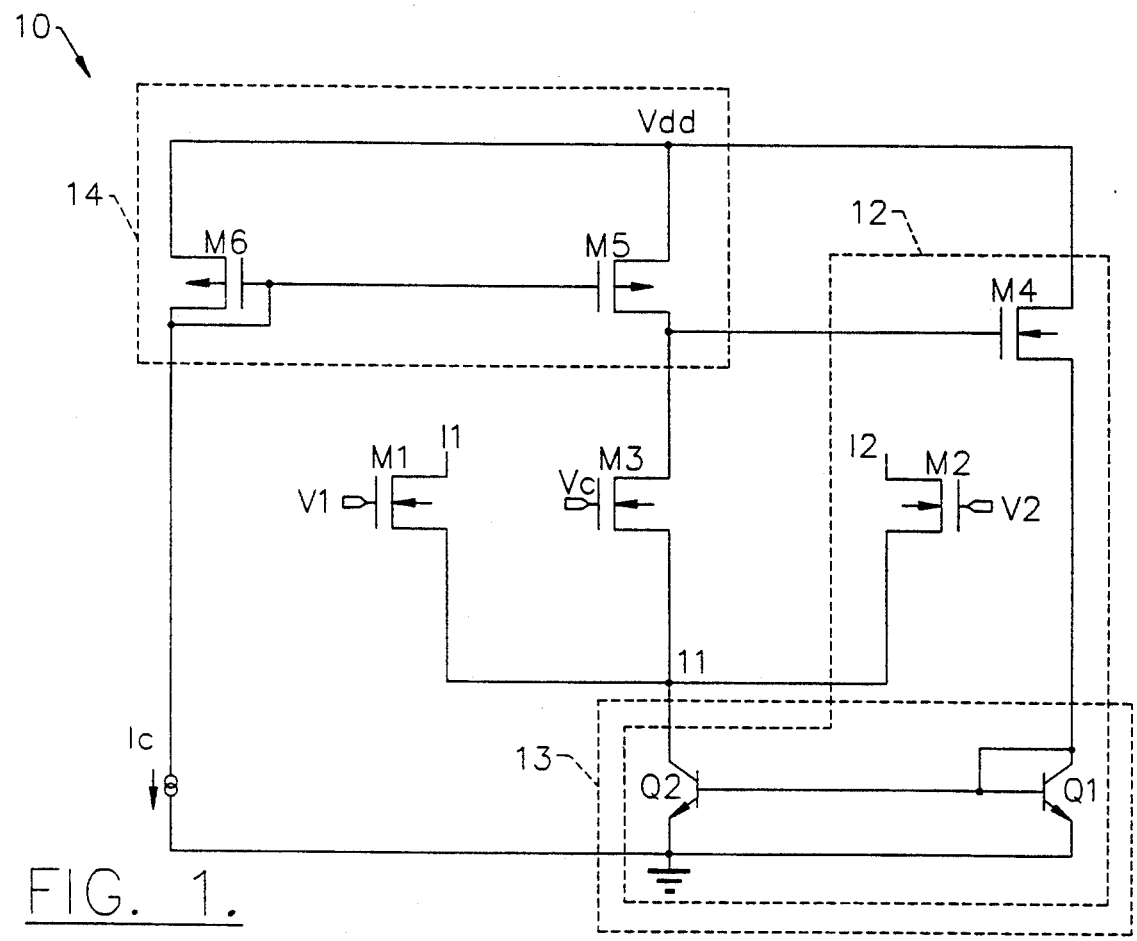
FIG. 1 is a circuit schematic of a voltage to current converter according to a first embodiment of the invention.

Referring to FIG. 1, there is shown a circuit diagram of a voltage to current converter 10 according to a first embodiment of the invention. A first FET M1, a second FET M2, and a third FET M3 are connected at their sources to define a common source node 11. A first balanced voltage input V1 is connected to the gate of the first FET M1. A second balanced voltage input V2 is connected to the gate of the second FET M2. A first current output I1 is connected to the drain of the first FET M1, and a second current output I2 is connected to the drain of the second FET M2.

A feedback network 12 is connected between the drain of the third FET M3 and the common source node 11. The loop gain and bandwidth of the feedback network 12 determine the converter's accuracy and speed. The feedback network 12 includes a fourth FET M4 arranged as a common drain follower with its gate connected to the drain of the third FET M3. A first bipolar transistor Q1 is also included in the feedback network 12, the collector of which is connected to both the source of the fourth FET M4 and its own base. A second bipolar transistor Q2 is connected as a first current mirror 13 with the first bipolar transistor Q1. Thus, the collector of the second bipolar transistor Q2 is connected to the common source node 11, and the base of the second bipolar transistor Q2 is connected to the base of the first bipolar transistor Q1. The emitters of the first bipolar transistor Q1 and the second bipolar transistor Q2 are also connected together. The common emitter connection of the first current mirror 13 is shown as coupled to ground, but those familiar with the art recognize that the emitter connection can be tied to a reference voltage.

The voltage to current converter 10 of the first embodiment also includes a fifth FET M5, the drain of which is connected to the drain of the third FET M3. A sixth FET M6 is connected as a second current mirror 14 with the fifth FET M5. Thus, the drain of the sixth FET M6 is connected to both its own gate and the gate of the fifth FET M5. Further, a current source Ic is connected between the drain of the sixth FET M6 and ground. Finally, a reference voltage Vdd is connected to the drain of the fourth FET M4, the source of the fifth FET M5, and the source of the sixth FET M6.

It is preferable in the first embodiment of the invention for Ic to be a constant current source. In this arrangement, the voltage Vc applied to the gate of the third FET M3 controls the circuit's transconductance. Constant current operation of Ic is preferred because the input impedance to the gate of the third FET M3 is very high. Therefore, a complex bridging circuit is not needed when applying the voltage Vc to the gate of M3.

In an alternative method of using the invention according to the first embodiment, the voltage Vc is held to a constant voltage to allow the current source Ic to control the circuit's transconductance. In addition, the transconductance of the circuit may also be controlled by simultaneously varying both the voltage Vc and the current source Ic. Whether varying Ic alone with Vc fixed, varying Vc alone with Ic fixed, or varying both Ic and Vc to control the circuit's transconductance, linearity can be maintained.

The converter of FIG. 1 produces good linearity, for example Total Harmonic Distortion $\leq 1.3\%$ for 4 $V_{p-p}$ inputs and 8 V supply voltage, and good transconductance tuning range. The current mirror 13 connected to the negative supply is composed of two bipolar transistors (Q1 and Q2) and its bandwidth for equal emitter area is approximately $f_T/2$. The invention can be realized with CMOS devices, however, BiCMOS is preferable to extend the input voltage range and speed. Speed and maximum input range may be improved with BiCMOS designs because BiCMOS processes allow the use of high performance NPN bipolar devices ($f_T \geq 2$ GHz and $V_{CEsat}=0.2$ V). For example, the performance of the voltage to current converter according to the first embodiment in FIG. 1 using a bipolar current mirror with its high $f_T$, low $V_{CEsat}$, good matching properties, and the high transconductance of bipolar transistors (relative to MOS devices) typically has superior performance than its all MOS counterpart.

Operation of this circuit is described as follows. The field effect transistors M1–M6 operate in the saturation region, and the bipolar transistors Q1–Q2 operate in the active region. Assume that Ic is a fixed reference current and Vc=0. Initially, the current through transistors M1 and M2 is Ic. As the input V1 changes, the source terminals of transistors M1, M2, and M3 follow accordingly. The currents through M3 and M5 are constant, therefore, any change in the differential inputs V1, V2 is amplified by the common gate transistor M3, and the result is fed back by M4, Q1 and Q2 in order to adjust the current through Q2. In other words, any increase in V1 forces the source and drain voltages of M3 to increase; which increases the gate to source voltage of M4 and the base to emitter voltage of Q1, and decreases the source voltage of M1, M2, and M3 back to its initial value. Thus, the collector voltage of Q2 remains constant. As long as the bipolar transistors Q1 and Q2 operate in the active region and the MOS transistors M3 and M5 operate in the saturation region, the common source node 11 is held at a virtual ground.

Assume MOS transistors M1 and M2 are matched (the size of M3 is arbitrary within reason) and operating in the saturation region. The transistors' drain current may be characterized by using the square law drain current expression, $I_d=K_n(V_{gs}-V_{TN})^2/2$. For an NMOS transistor $K_N=(\mu_{eff} C_{ox} W/L)_N$ (where $\mu_{eff}$ is the effective electron mobility, $C_{ox}$ is the gate oxide per unit area, W is the channel width, and L is the channel length). Assuming $V_{T1}=V_{T2}=V_{T3}$, the DC transfer equation of the voltage to current converter is:

$$V1 - Vc = V_{gs1} - V_{gs3} = \sqrt{\frac{2I1}{K_1}} - \sqrt{\frac{2Ic}{K_3}} \quad (1)$$

$$= V_{gs3} - V_{gs2} = \sqrt{\frac{2Ic}{K_3}} - \sqrt{\frac{2I2}{K_1}}$$

$$I1 = \frac{K_1(V1-Vc)^2}{2} + \frac{K_1 Ic}{K_3} + \sqrt{\frac{2Ic}{K_3}} K_1(V1-Vc) \quad (2)$$

$$I2 = \frac{K_2(V1+Vc)^2}{2} + \frac{K_2 Ic}{K_3} + \sqrt{\frac{2Ic}{K_3}} K_2(V1+Vc) \quad (3)$$

Assuming $K_1=K_2=K$ and $V2=-V1$, the expression for the differential output current is:

$$Iout = I1 - I2 = 2V1\,K\left(\sqrt{\frac{2Ic}{K_3}} - Vc\right) \quad (4)$$

If $Vc = 0$, then $I1 - I2 = 2\,V1\,K\sqrt{\frac{2Ic}{K_3}}$

Thus, the reference current Ic may be used to control the transconductance. If Ic is fixed, then Vc controls the transconductance. The circuit functions as a voltage controlled square root circuit when V1 operates as a controlling voltage.

The linear range of the circuit extends to the values of Vc which provide linear differential output current. The input range limit for $V_{BE1max}=V_{BE2max}$ is:

$$|V1| \leq \sqrt{\frac{K_{n4}\,Vx^2 - 6Ic + 4Vc\sqrt{2KIc} - 2KVc^2}{2K}} \quad (5)$$

$$Vx = Vdd - V_{T4} - V_{BE1max} - \sqrt{\frac{2Ic}{K_{ps}}} - Vss$$

($Vss = 0$)

Equation (5) assumes that the circuit behaves nonlinearly when any MOS device M1–M6 begins to operate outside the saturation region. The linear range is maximized by choosing a large value for $K_4$ and large emitter areas for Q1 and Q2 and small values for Ic and $K_1$. Equations (2) and (3) show that any mismatch between M1 and M2 results in second order harmonic distortion. Any mismatch between [M1, M2] and M3 results in DC offset, which can lower the maximum input range.

The voltage to current converter according to the first embodiment has only one transistor between the input and output terminals. The feedback loop (M4, Q1 and Q2) extends the linear input range of the common source differential stage (M1, M2 and Q1). Biasing is provided by a common gate transistor M4, a source follower M5, and the bipolar current mirror 13. A passive frequency compensation network $R_c$ and $C_c$ (not shown in FIG. 1) may be serially connected between the common source node 11 and the drain of M3. The loop has one left half plane zero and three left half plane poles without the compensation network. The zero and two of the poles reside at very high frequencies. The parasitic resistances and capacitances at the high impedance node of the loop (drains of M3 and M4 and the gate of M6) determine the dominant pole of the open loop system (input applied to the gate of M6, output taken at the drain of M3). The loop should be unconditionally stable, with no compensation network needed, if fast bipolar and MOS devices are used, or when all devices in the voltage to current converter are MOSFETs. Frequency operation of the converter can be maximized by moving poles and zeros to much higher frequencies, thereby reducing the effect of parasitic devices within the loop. If the parasitic poles are not widely separated and the loop has significant gain, then a compensation network should be introduced to assure closed loop stability.

Figure 2:
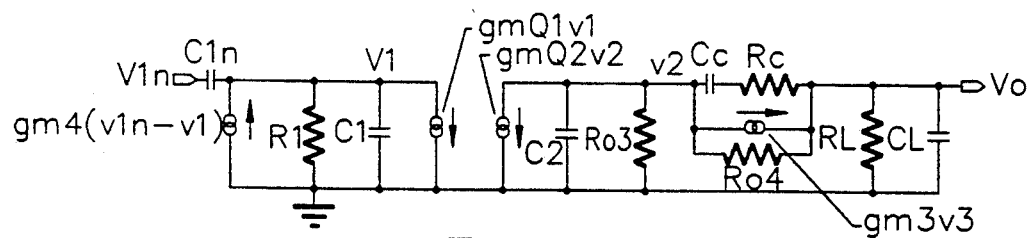
FIG. 2 is the open loop small signal equivalent of the voltage to current converter shown in FIG. 1.

Referring to FIG. 2 there is shown the open loop small signal equivalent of the voltage to current converter according to the first embodiment of the invention. In FIG. 2 $C_{in}=C_{gsm4}$; $C1=C_{gsm4}+C_{\pi Q2}+C_{\pi Q3}+C_{csQ1}+C_{sbM4}+(g_{mQ2}r_o+1)Cm$; $Cm=C_{cbQ2}$; $C2=C_{csQ2}+C_{sbM1-M3}+Cm$; $CL=C_{gsm4}+C_{dbM3,M5}+C_{gdM4}+C_{sdM3}+C_{gdM4}$; $R1=1/g_{o2}|R\pi_{Q2}|R\pi_{Q3}$; $Ro3=1/g_{o3}$; $Ro4=1/g_{o4}$; $RL=1/g_{o4}$; $g_{mi}$ (i=1–4) is the transconductance of ith transistor; and $r_o$ is the equivalent resistance at the source terminals of transistors M1–M3.

The small signal analysis of the circuit in FIG. 2 reveals the stability behavior of the closed loop feedback of the converter. Without the compensation network, the loop has a zero and three poles. Adding the compensation network adds an additional pole/zero pair. Assuming that $R_c << RL$ and $r_{o3}$, and the poles are widely separated, then the approximate expressions for the loop transmissions and the DC loop gain are:

$$Z_1 = -\frac{g_{m4}}{C_{in}} \quad (6)$$

$$Z_2 = -\left[\frac{g_{m4}}{(C_c + g_{m3} R_c C_c)}\right]$$

$$P_1 = -\frac{g_{m4} + g_{mQ2} + \frac{1}{R1}}{(C1 + C_{in})}$$

$$P_2 = -\left[\frac{1}{(R_c C_c)} + \frac{1}{(R_c C2)} + \frac{g_{m3}}{C2} + \frac{1}{(R_c CL)}\right]$$

$$P_3 = -\left[\frac{\frac{g_{m3}}{(R_c C_c C2)} + \frac{1}{(C2\,CL\,r_{o3}\,R_c)} + \frac{1}{(C2\,CL\,r_{oQ2}\,R_c)}}{P2}\right],$$

$$+ \frac{\frac{1}{(R_c C_c CL RL)} + \frac{1}{(C2 CL R_c RL)} + \frac{g_{m3}}{(C2 CL RL)} + \frac{1}{(R_c C_c CL r_{o3})}}{P2}\Bigg]$$

$$P_4 = -\frac{g_{m3}}{(C2 R_c C_c CL RL P_2 P_3)}$$

$$A_{vdc} = \frac{g_{m4} g_{mQ3} r_{oM4} RL}{(1 + g_{m4} r_{oM4} + g_{mQ1} r_{oM4})}$$

By setting $IR_c$ to infinity or $C_c$ to zero, the pole/zero locations for the uncompensated loop are found. High loop gain lowers the distortion and the speed, therefore, an optimum loop gain should be chosen to maximize the operating speed. The mismatch between M1 and M2 should also be considered while calculating the loop gain.

The inventive converter can have fast AC and transient behaviors by choosing appropriate parameters of the devices in the loop as described above. Also known as emitter degeneration, inserting a resistor between each emitter and ground allows practical matching of the bipolar transistors. Emitter degeneration improves the closed loop stability, reduces the bipolar device matching error and temperature sensitivities, and improves the current mirror output impedance.

Figure 3:
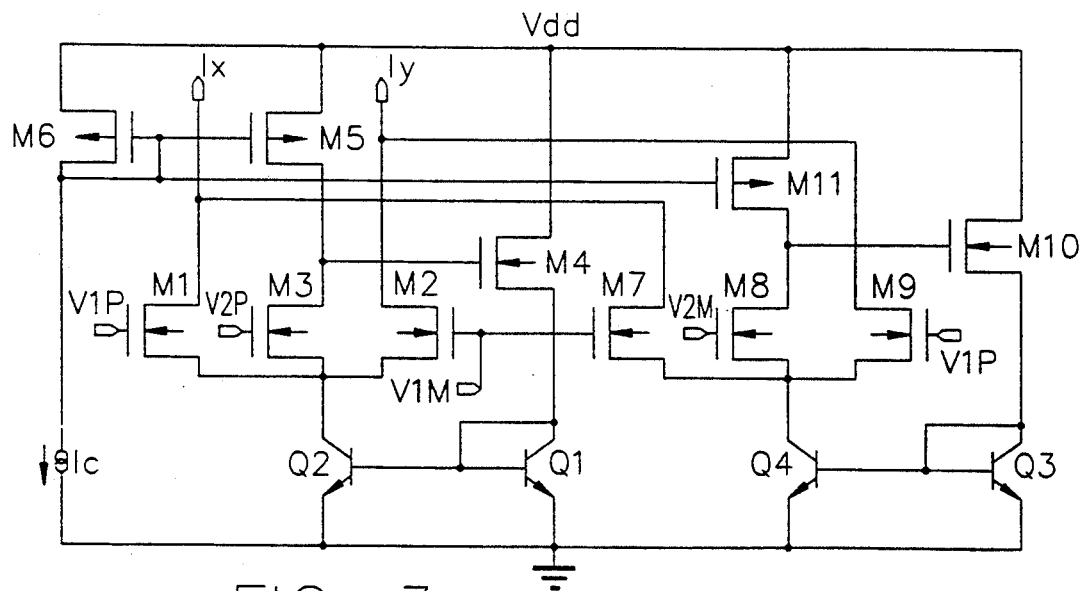
FIG. 3 is a circuit schematic of an analog four quadrant multiplier based on the converter shown in FIG. 1.

An analog four quadrant multiplier can be made by connecting two of the voltage to current converters of FIG. 1 in parallel. As illustrated in FIG. 3, two converters of FIG. 1 may be connected in parallel by coupling the reference voltages and current outputs of a first and second voltage to current converter in parallel; eliminating the current source of the second converter; combining the second current mirror of both converters, but with one less FET overall; tying the first balanced input voltage of the first converter with the second balanced input voltage of the second converter; and tying the second balanced input voltage of the first converter with the first balanced input voltage of the second converter. FIG. 3 shows such a multiplier, where M1–M5 and Q1–Q2 is the first converter and M7–M11 and Q3–Q4 is the second converter. Transistor M6 and the current source Ic provide the biasing currents to the multiplier. The DC transfer equation of the four quadrant multiplier is:

$$I1 = \frac{K_1(V1P - V2P)^2}{2} + \frac{K_1 Ic}{K_3} + \sqrt{\frac{2Ic}{K_3}} K_1(V1P - V2P) \quad (7)$$

$$I2 = \frac{K_2(V1M - V2P)^2}{2} + \frac{K_2 Ic}{K_3} + \sqrt{\frac{2Ic}{K_3}} K_2(V1M - V2P) \quad (8)$$

$$I7 = \frac{K_7(V1M - V2M)^2}{2} + \frac{K_7 Ic}{K_8} + \sqrt{\frac{2Ic}{K_8}} K_7(V1M - V2M) \quad (9)$$

$$I9 = \frac{K_9(V1P - V2M)^2}{2} + \frac{K_9 Ic}{K_8} + \sqrt{\frac{2IC}{K_8}} K_9(V1P - V2M) \quad (10)$$

where, Ii (i=1,2, ... ) is the current through the ith transistors. Assuming $V1P = -V1M = V1$; $V2P = -V2M = V2$; $K_1 = K_2 = K_3 = K_7 = K_8 = K_9 = K$ and by appropriately combining these currents, the desired output current is:

$$Iout = Ix - Iy = -I1 + I2 - I7 + I9 = 2K\, V1\, V2 \quad (11)$$

The above multiplication function is achieved with a very small number of transistors, and the parallel architecture allows a response time equal to that of a single voltage to current converter. The theoretical linear range of this multiplier is also the same as that of the voltage to current converter building block (V2 replacing Vc). Therefore, the limit of the input voltage range is defined by Min ($|V1|,|V2|$), where:

$$|V1| \leq \sqrt{\frac{K_{n6} Vx^2 - 6Ic + 4V2\sqrt{2KIc} - 2K V2^2}{2K}} \quad (12)$$

where, $$Vx = Vdd - Vss - V_{T6} - V_{BE2max} - \sqrt{\frac{2Ic}{K_{p4}}} \quad (Vss = 0)$$

$$|V2| \leq \sqrt{\frac{K_{n10} Vx^2 - 6Ic + 4V1\sqrt{2KIc} - 2KV1^2}{2K}} \quad (12)$$

where, $$Vx = Vdd - Vss - V_{T10} - V_{BE4max} - \sqrt{\frac{2Ic}{K_{p11}}} \quad (Vss = 0)$$

The linearity and device matching requirements of the multiplier is similar to that of the voltage to current converter building block. However, total harmonic distortion response will suffer if balanced differential input signals are not used.

Figure 4:
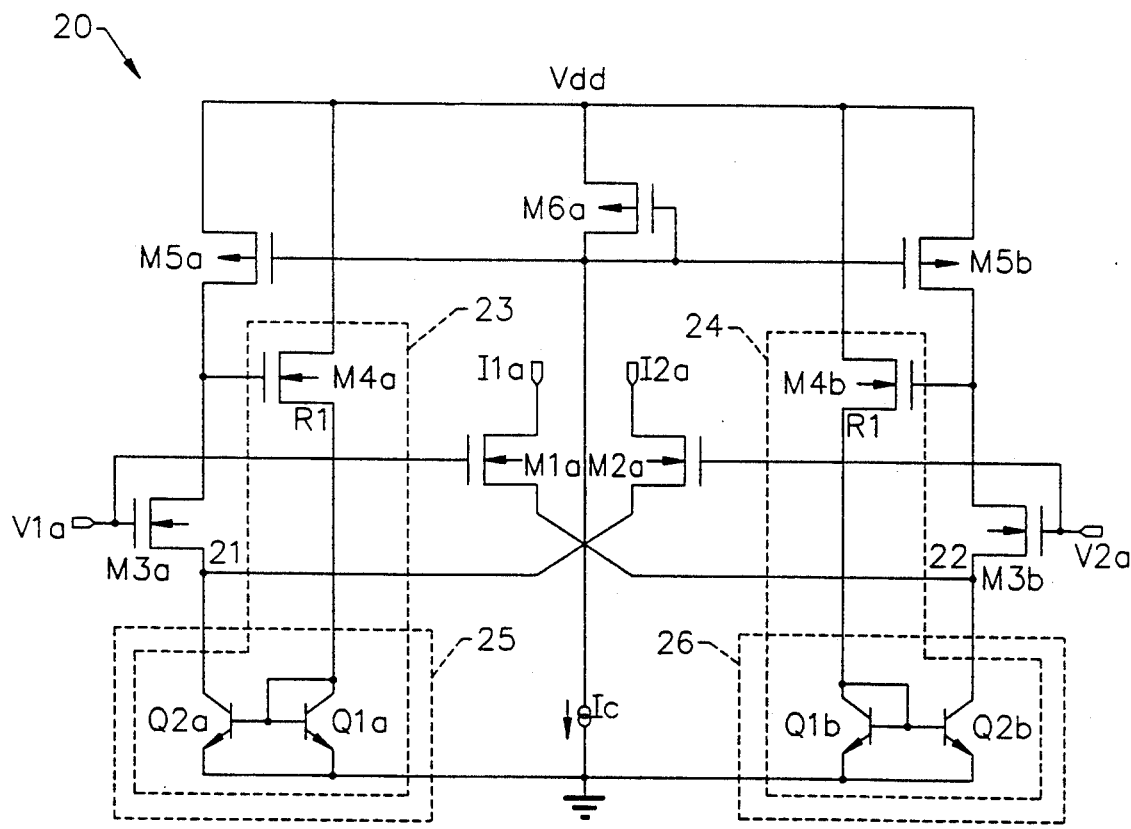
FIG. 4 is a circuit schematic of a voltage to current converter according to a second embodiment of the invention.

The second embodiment of the invention, capable of receiving unbalanced inputs, evolved from the first embodiment. The converter 20 in FIG. 4 was derived by connecting two of the voltage to current converters 10 shown in FIG. 1 in parallel. Although there are differences in the multiplier of FIG. 3 and the converter of FIG. 4, they are nevertheless both variations of two converters of FIG. 1 connected in parallel. As illustrated in FIG. 4, two converters of FIG. 1 may be connected in parallel by coupling the reference voltages of a first and second voltage to current converter in parallel; eliminating the current source of the second converter; combining the second current mirror of both converters, but with one less FET overall; and tying the former V1 voltage inputs with the opposite converter's former Vc voltage input. Thus, V1a and V2a of FIG. 4 subsume Vc from FIG. 1.

Referring to FIG. 4, there is shown a circuit diagram of a voltage to current converter 20 representing a second embodiment of the invention. A first FET M3a and a second FET M2a have their sources connected to define a first common source node 21. A third FET M1a and a fourth FET M3b also have their sources connected together, but to define a second common source node 22. A first voltage input V1a is connected to the gate of the first FET M3a and the gate of the third FET M1a. A second voltage input V2a is connected to the gate of the second FET M2a and the gate of the fourth FET M3b. A first current output I1a and a second current output I2a are connected to the drains of the third FET M4a and the second FET M2a, respectively. A fifth FET M4a is arranged as a common drain follower with its gate connected to the drain of the first FET M3a. A sixth FET M4b is also arranged as a common drain follower, but its gate is connected to the drain of the fourth FET M3b. A seventh FET M5a has its drain connected to the drain of the first FET M3a. A current source Ic is connected between the gate of the seventh FET M5a and ground. An eighth FET M6a has its drain and gate connected to the current source Ic. A ninth FET M5b has its gate connected to the current source Ic and its drain connected to the drain of the fourth FET M3b. A reference voltage vdd is connected to the drains of the fifth FET M4a and sixth FET M4b, and the sources of the seventh FET M5a, eighth FET M6a, and the ninth FET M5b.

A first feedback network 23 (M4a, Q1a, and Q2a) includes a first bipolar current mirror 25 which itself includes a first bipolar transistor Q1a, with its collector connected to both the source of the fifth FET M4a and its own base. The collector of a second bipolar transistor Q2a is connected to the first common source node 21. The base of the second bipolar transistor Q2a is connected to the base of the first bipolar transistor Q2a, and the emitters of both the first bipolar transistor Q1a and the second bipolar transistor Q2a are connected to ground.

A second feedback network 24 (M4b, Q1b, and Q2b) includes a second bipolar current mirror 26 which itself includes a third bipolar transistor Q1b with its collector connected to both the source of the sixth FET M4b and its own base. The collector of a fourth bipolar transistor Q2b, is connected to the second common source node 22. The base of the fourth bipolar transistor Q2b is connected to the base of the third bipolar transistor Q1b, and the emitters of both the third bipolar transistor Q1b and the fourth bipolar transistor Q2b are connected to ground.

In the second embodiment of the invention, the current source Ic operates to control the converter's transconductance. In this arrangement, the control voltage Vc of the first embodiment has been eliminated to allow the circuit to accept unbalanced voltage inputs. In addition, as with the first embodiment, those familiar with the art recognize that the connections to ground could also be connections to a second reference voltage within a more complex circuit.

The linear DC large signal transfer function of the circuit in FIG. 4 does not rely on balanced inputs. Assuming matched transistors operating in the saturation region ($K_1=K_2=K_3=K_4=K$), the DC large signal transfer function is:

$$I1 = \frac{K(V1 - V2)^2}{2} + Ic + \sqrt{2IcK} \ (V1 - V2) \quad (13)$$

$$I2 = \frac{K(V1 - V2)^2}{2} + Ic - \sqrt{2IcK} \ (V1 - V2)$$

$$I1 - I2 = \sqrt{8IcK} \ (V1 - V2)$$

$$gm = \frac{I1 - I2}{V1 - V2} = \sqrt{8IcK}$$

Any mismatch between transistors M1a and M2a will degrade the transconductor linearity with mainly a second order harmonic distortion. Any mismatch between [M1a,M2a] and [M3a,M3b] introduces a DC offset in the circuit.

The linear input range constraint of the converter of the second embodiment is:

$$|V1 - V2| \leq Min \left[ \left( \sqrt{\frac{2Ic}{K}} - \sqrt{\frac{K_{n4a}}{K} \left( V_{dd} - V_{4a} - V_{BE1amax} - \sqrt{\frac{2Ic}{K_{p5a}}} \right)^2 - \frac{2Ic}{K}} \right), \right.$$

$$\left. \left( \sqrt{\frac{2Ic}{K}} - \sqrt{\frac{K_{n4b}}{K} \left( V_{dd} - V_{T4b} - V_{BE1bmax} - \sqrt{\frac{2Ic}{K_{p5b}}} \right)^2 - \frac{2Ic}{K}} \right) \right] \quad (14)$$

Equation (14) is derived with no balanced input constraint.

Figure 5:
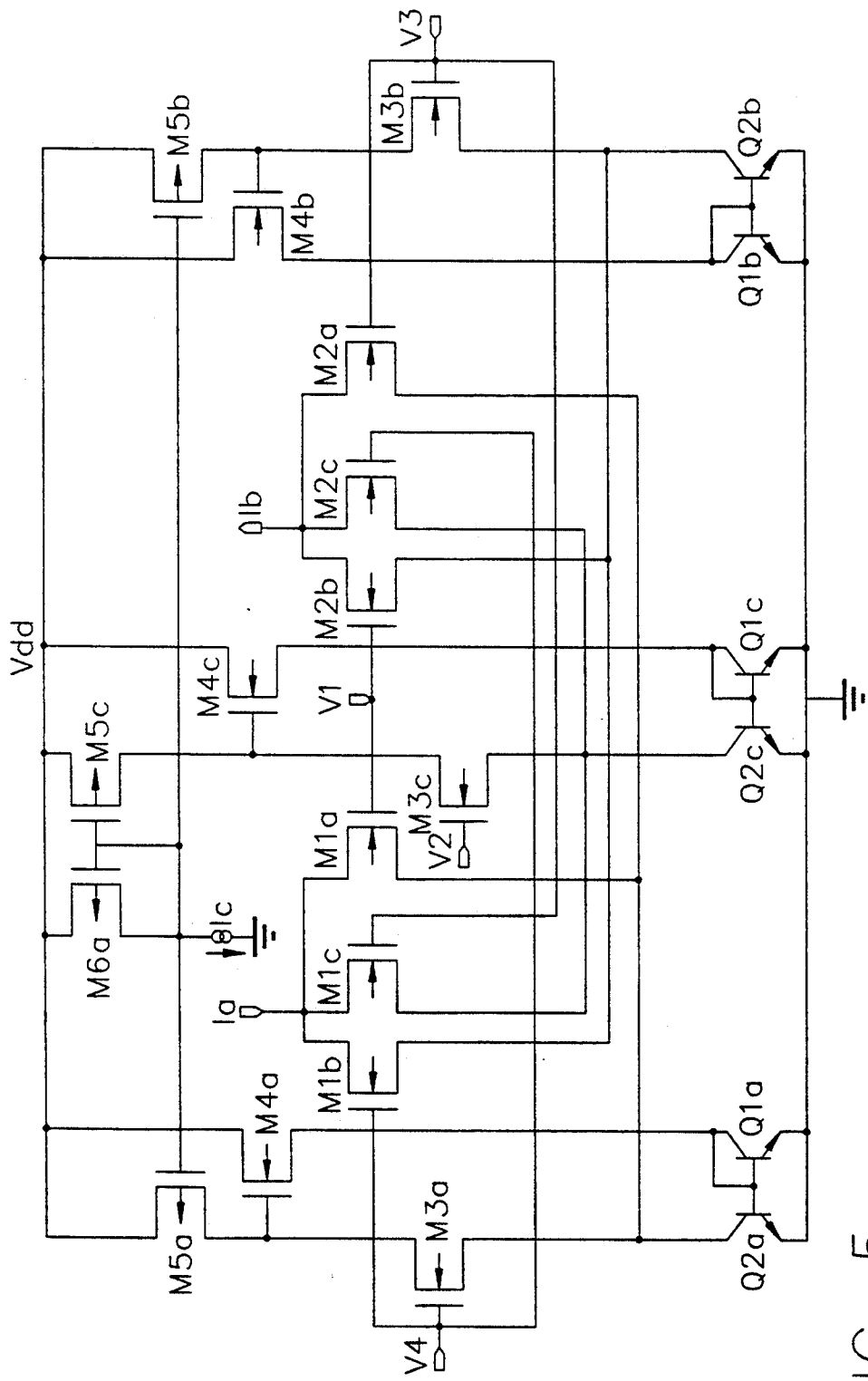
FIG. 5 is a circuit schematic of an analog four quadrant multiplier based on the converter shown in FIG. 4.

An analog four quadrant multiplier with no balanced input requirement can be constructed by connecting three of the voltage to current converters of FIG. 1 in parallel. This multiplier is shown in FIG. 5. As illustrated in FIG. 5, three converters of FIG. 1 may be connected in parallel by coupling the reference voltages of a first (M1a, M2a, M3a), second (M1b, M2b, M3b), and third (M1c, M2c, M3c) voltage to current converters of FIG. 1 in parallel; coupling the former I1 current outputs in parallel; coupling the former I2 current outputs in parallel; eliminating the current source of the second and third converters; combining the second current mirror of all three converters; coupling the gate of the first FET M1a of the first converter with the gate of the second FET M2b of the second converter; coupling the gate of the third FET M3a of the first converter with the gate of the first FET M1b of the second converter and the gate of the second FET M2c of the third converter; and coupling the gate of the third FET M3b of the second converter with the gate of the second FET M2a of the first converter and the gate of the first FET M1c of the third converter.

The characterization of linearity and device matching regarding the first embodiment of the converter applies to this multiplier circuit as well. Three drain terminals are connected to each output, therefore, the capacitive loading on the outputs is higher. Assuming equal device sizes for the input transistors, those whose gates are connected to input voltages $V_1$ through $V_4$, the DC large signal transfer function is:

$$I_{out}=I_x-I_y=I_2+I_3+I_4-I_{13}-I_{14}-I_{15}=K(V_1-V_2)(V_3-V_4) \quad (15)$$

where $I_i$ is the current through the ith transistor.

EXAMPLES

The circuits of FIGS. 1 and 3-5 were extensively simulated by SPICE/SABER programs to validate theory. Simulations used 2 μm BiCMOS device parameters and a power supply of 8 V. The nominal values of the basic device parameters are provided in Table 1.

TABLE 1

| The nominal parameters of the BiCMOS devices | |
|---|---|
| NPN with single buried layer | $\beta = 100$, $f_T \approx 2$ GHz (Ic = 300 μA), $R_C = 100\,\Omega$, $r_b = 2000\,\Omega$ $V_A = 80$ V and $I_s = 10^{-15}$ A |
| NWell CMOS | $T_{ox} = 400$ AO, $K_n = C_{ox} = 4.5 \times 10^{-5}$ A/V², $K_p = \mu_{Po} C_{ox} = 1.7 \times 10^{-5}$ A/V² |

Figure 6:
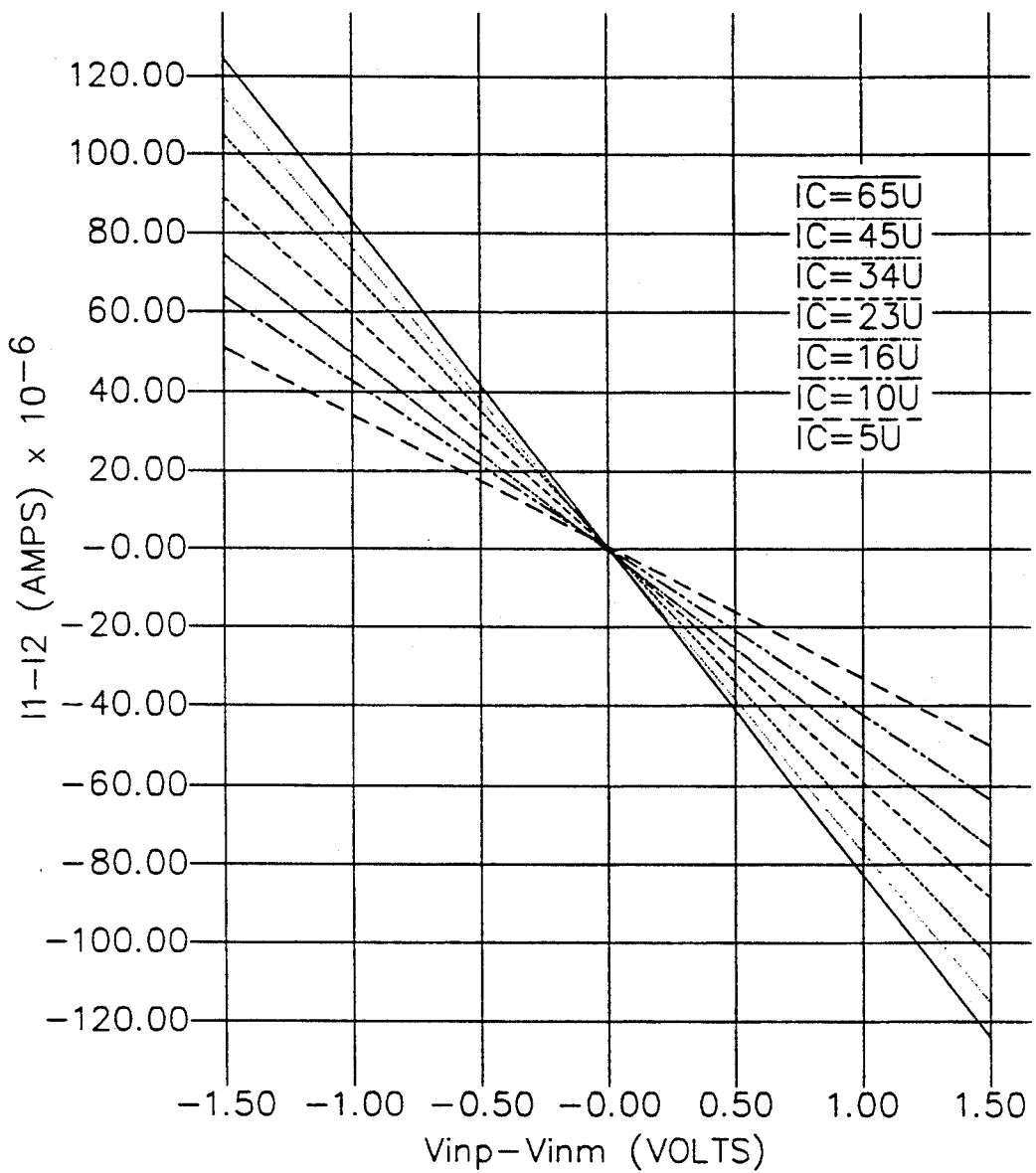
FIG. 6 graphically illustrates the simulated DC transfer curves of the converter of FIG. 1.
Figure 7:
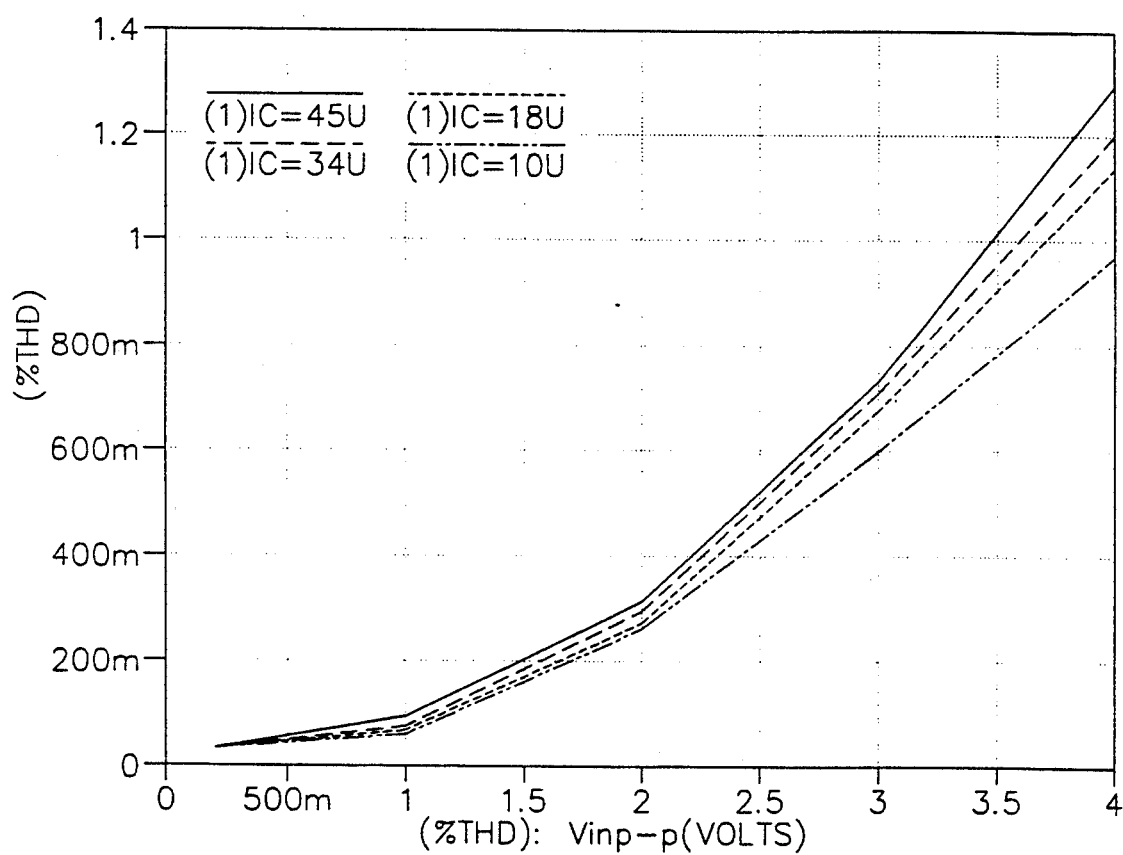
FIG. 7 graphically illustrates the simulated Total Harmonic Distortion of the converter of FIG. 1.
Figure 8:
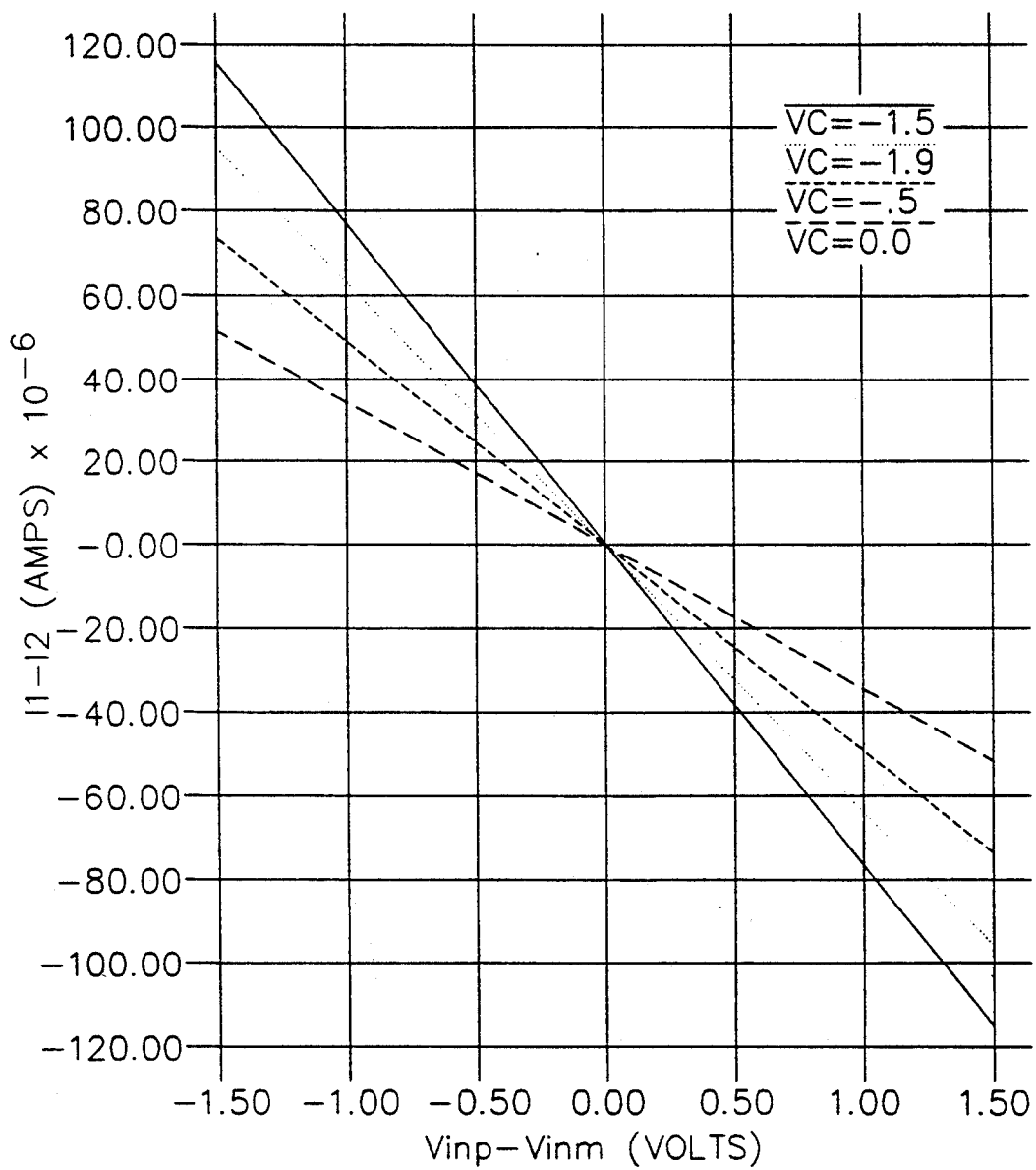
FIG. 8 graphically illustrates the simulated DC transfer curve of the converter of FIG. 1 with Ic fixed.

FIG. 6 provides the DC transfer curves of the basic voltage to current converter of FIG. 1. The current source Ic has been varied to obtain the various curves, which demonstrate good linearity. The graph in FIG. 7 was obtained by taking the Fourier transform of the circuit time response, and illustrates the THD produced by the transconductor. The worst case nonlinearity (THD≦1.3% for 4 $V_{p\text{-}p}$ inputs and 8 V supply voltage) occurs at high values of Ic because high device current requires high on voltages which reduce the voltage range for the devices within the circuit. FIG. 8 is the DC transfer curves of the voltage to current converter where Vc was used to vary the transconductance while Ic was kept fixed.

Figure 9:
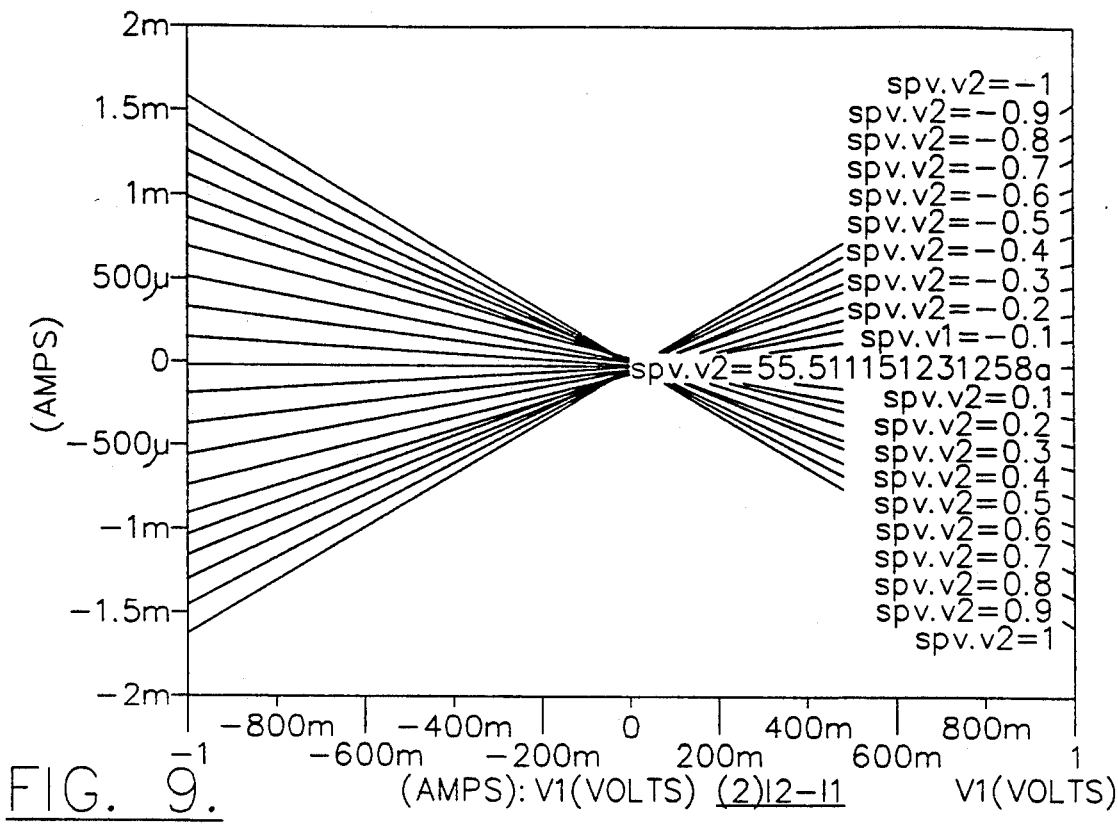
FIG. 9 graphically illustrates the simulated DC transfer curves of the four quadrant multiplier of FIG. 3.
Figure 10:
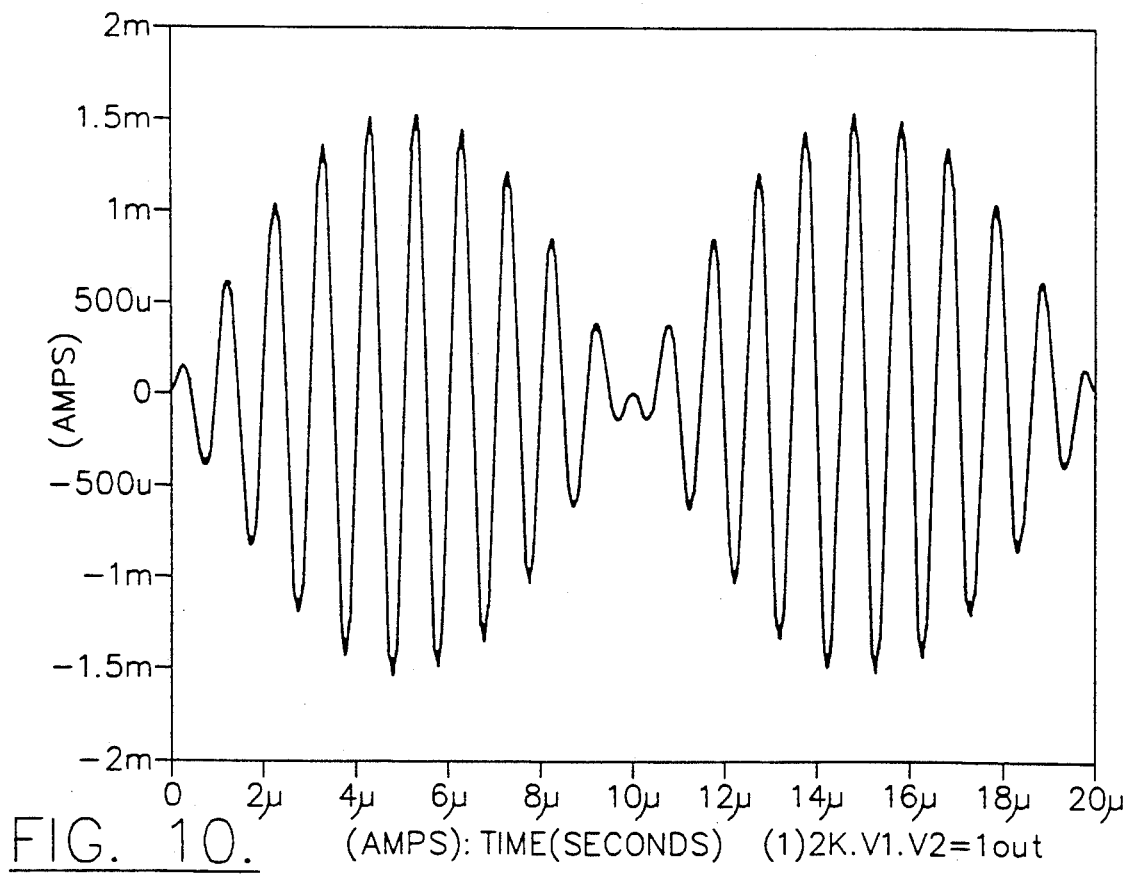
FIG. 10 graphically illustrates the simulated multiplication of two sine waves by the multiplier of FIG. 3.

The results in FIG. 9 are the DC transfer characteristics of the multiplier in FIG. 3. The vertical axis provides the differential output current and the horizontal axis shows the range the input voltage V1 was varied. The curves were obtained by varying the second input voltage V2. Excellent linearity is clearly evident. To further exercise the response of the multiplier, two sine wave signals ($f_{V1}=50$ KHz, $V1_{p\text{-}p}=2$ V and $f_{V2}=1$ MHz, $V2_{p\text{-}p}=2$ V) were multiplied with results shown in FIG. 10.

Figure 11:
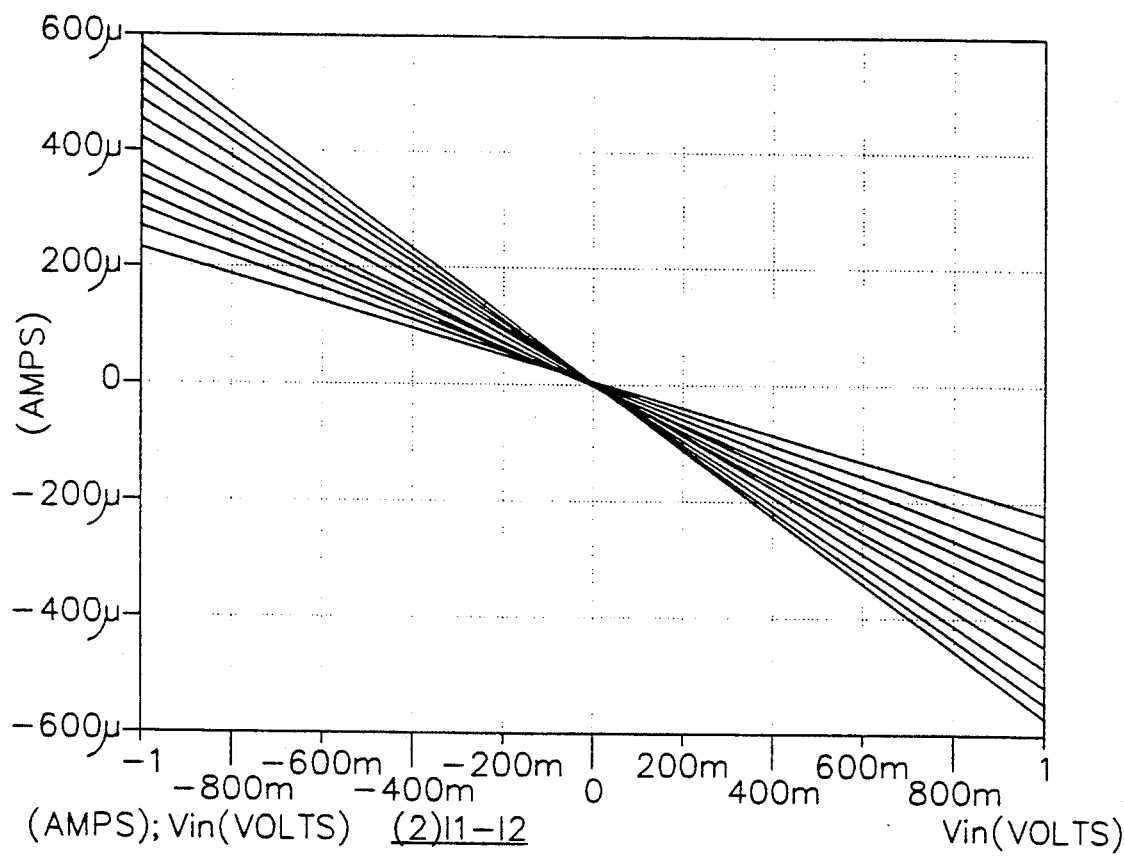
FIG. 11 graphically illustrates the simulated DC transfer curves of the converter of FIG. 4.

FIG. 11 shows the DC transfer curves of the voltage to current converter in FIG. 4. Again, good linearity is evident, and excellent agreement between the analysis and simulation is obtained.

Figure 12:
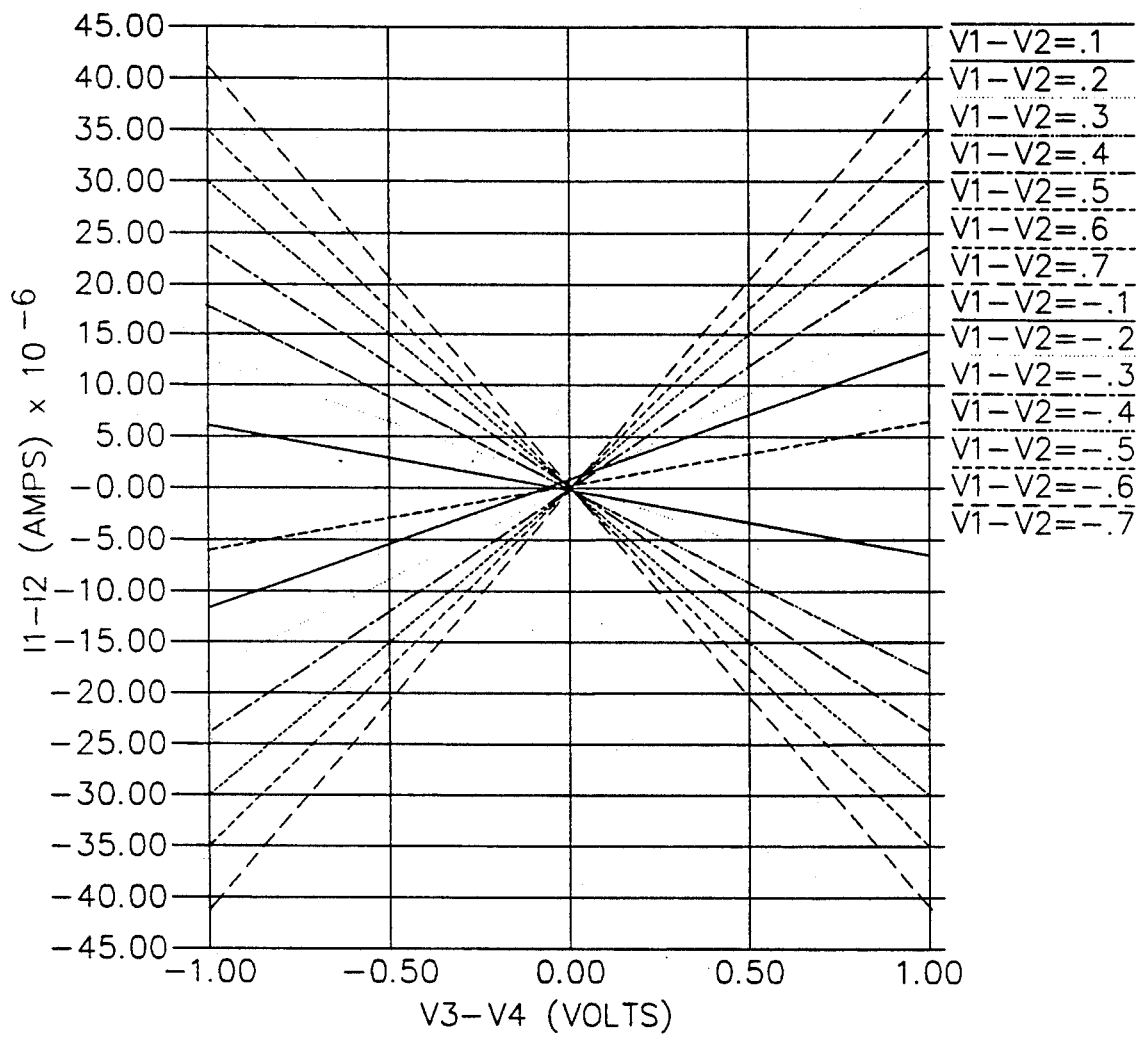
FIG. 12 graphically illustrates the simulated DC transfer curves of the four quadrant multiplier of FIG. 5.

The graph in FIG. 12 provides the DC transfer curves of the multiplier in FIG. 5. These curves were obtained for V2=0. The differential input voltage V3-V4 was varied from −1 V to 1 V for various values of V1.

The circuits of FIGS. 1 and 3-5 were fabricated in a CMOS-based BiCMOS process. The process used CMOS devices with a minimum feature size of 2 μm and vertical NPN bipolar transistors with buried layer. Buried layer construction involves a relatively highly doped layer under the collector of bipolar devices. Using buried layer techniques aids in achieving low collector intrinsic resistances and results in high transition frequencies.

Figure 13A:
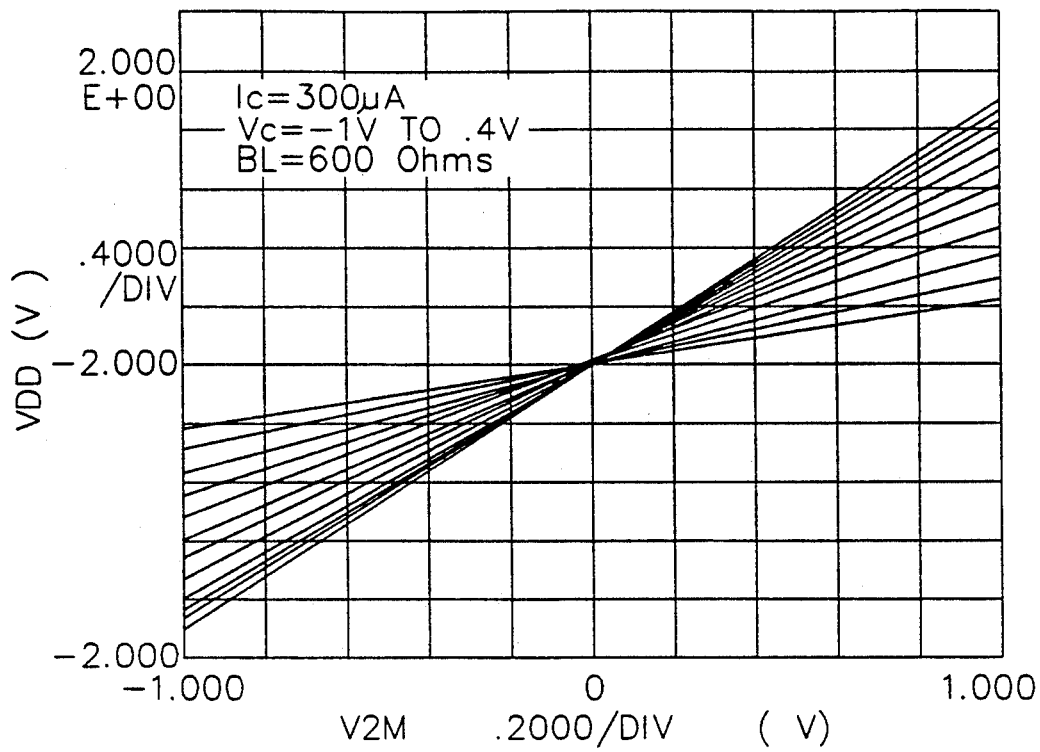
FIG. 13(a) graphically illustrates the measured DC transfer curves of the circuit in FIG. 1 with Vc controlling the transconductance.
Figure 13B:
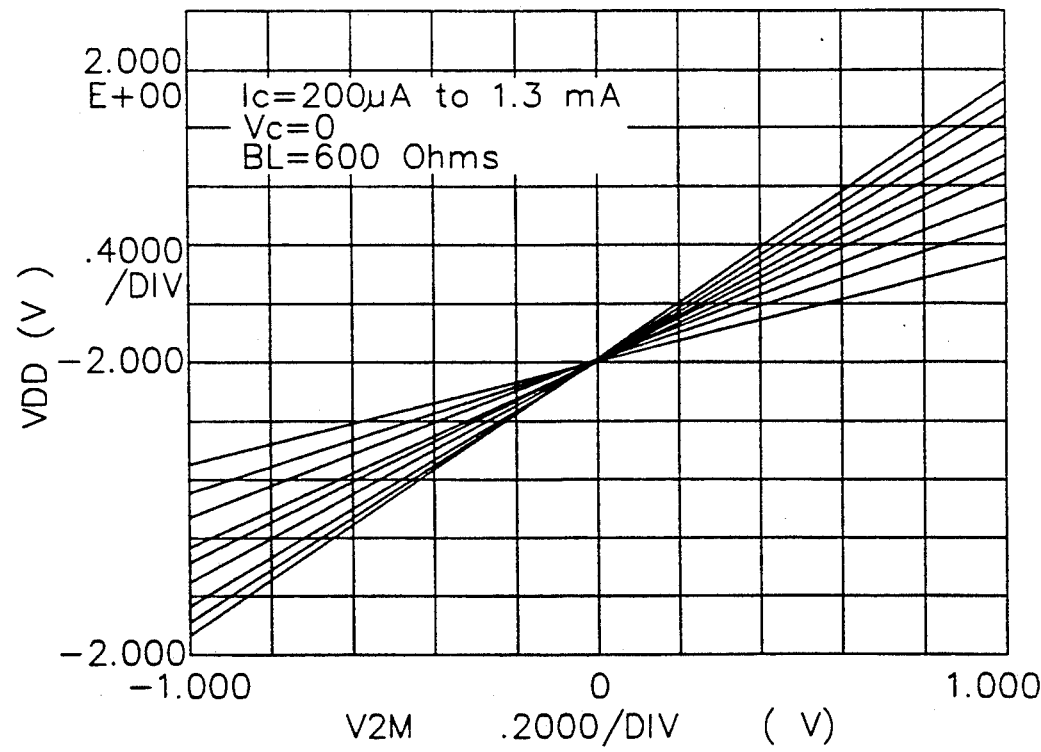
FIG. 13(b) graphically illustrates the measured DC transfer curves of the circuit in FIG. 1 with Ic controlling the transconductance.

FIG. 13 shows the measured DC transfer curves of the converter of FIG. 1. All DC measurements were made using the HP 4145B Semiconductor Parameter Analyzer. The curves in FIG. 13a were obtained for Ic= 300 μA with a supply voltage of ±4 V. Vc was varied from −1 V to 0.4 V. FIG. 13b shows the measured DC transfer curves when Vc was set to zero and the control current Ic was varied from 200 μA to 1.5 mA. The output currents I1 and I2 were converted to voltages by inserting a 600Ω (approximate value of the on-chip resistors) resistor between each drain terminal of transistors M1 and M2 and the positive supply. The vertical axis in FIG. 13 represents the measured differential output voltage.

Figure 14:
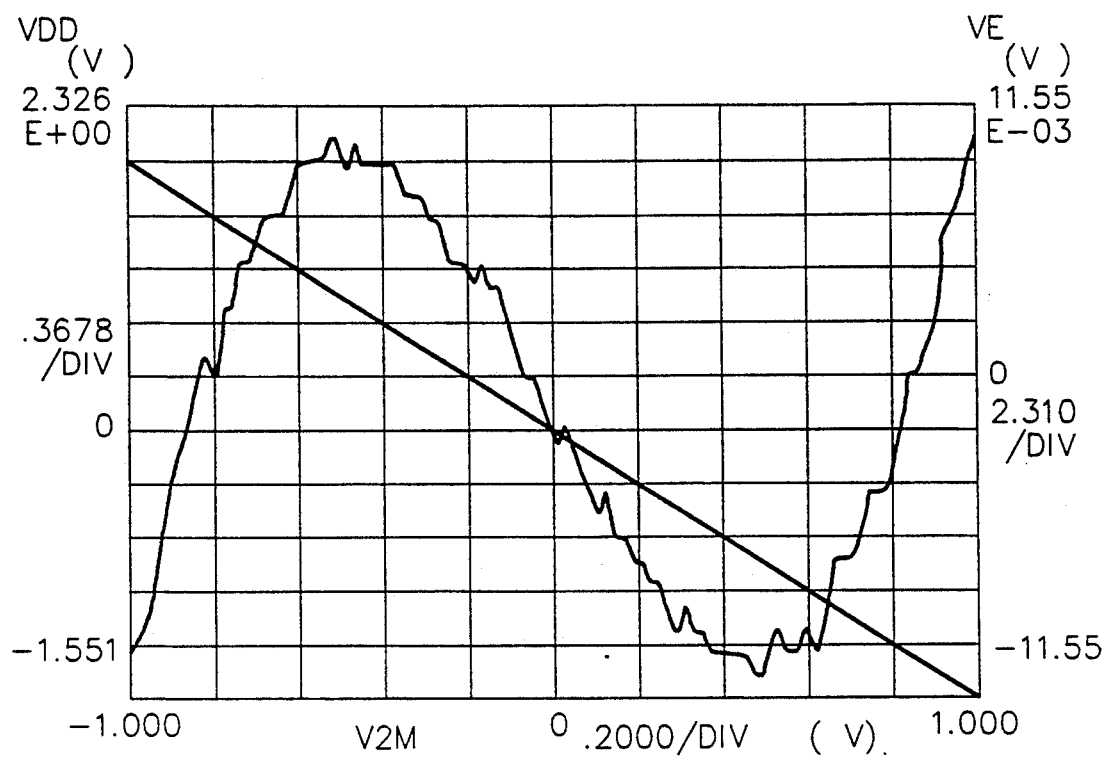
FIG. 14 is the measured DC transfer curve and the relative linearity error of the circuit in FIG. 1.

The plot in FIG. 14 is the measured DC input-output characteristic and the relative linearity error for Ic=300 μA, Vc=0 V, and a 2 $V_{p\text{-}p}$ differential input voltage. From this plot the transconductance was measured as 1.0 mmho, and the total nonlinearity error was within ±0.5 percent.

Figure 15:
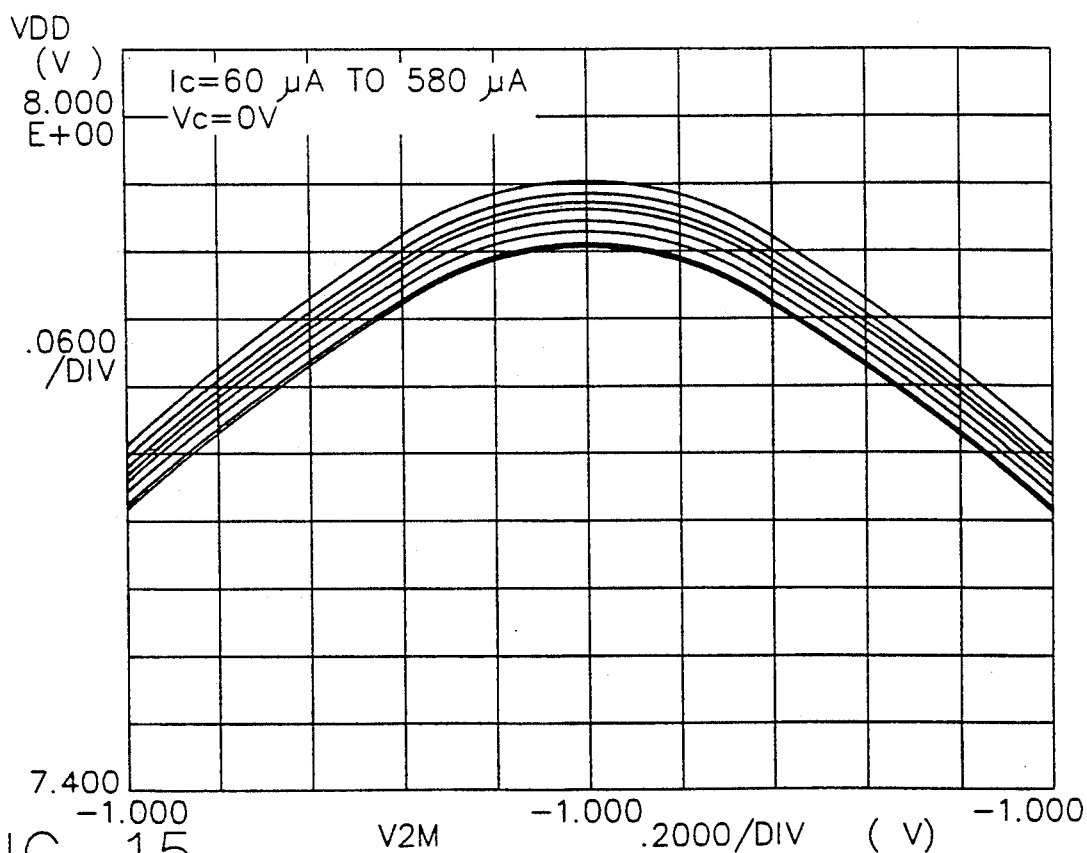
FIG. 15 is the measured sum of the output voltages of the circuit in FIG. 1 with Vc=0 and Ic varied.

FIG. 15 shows the measured DC transfer curves of the sum of the output voltages (output currents through 600Ω resistors) when Vc was set to zero and the control current Ic was varied from 60 μA to 580 μA. These curves agree closely with theory.

Figure 16:
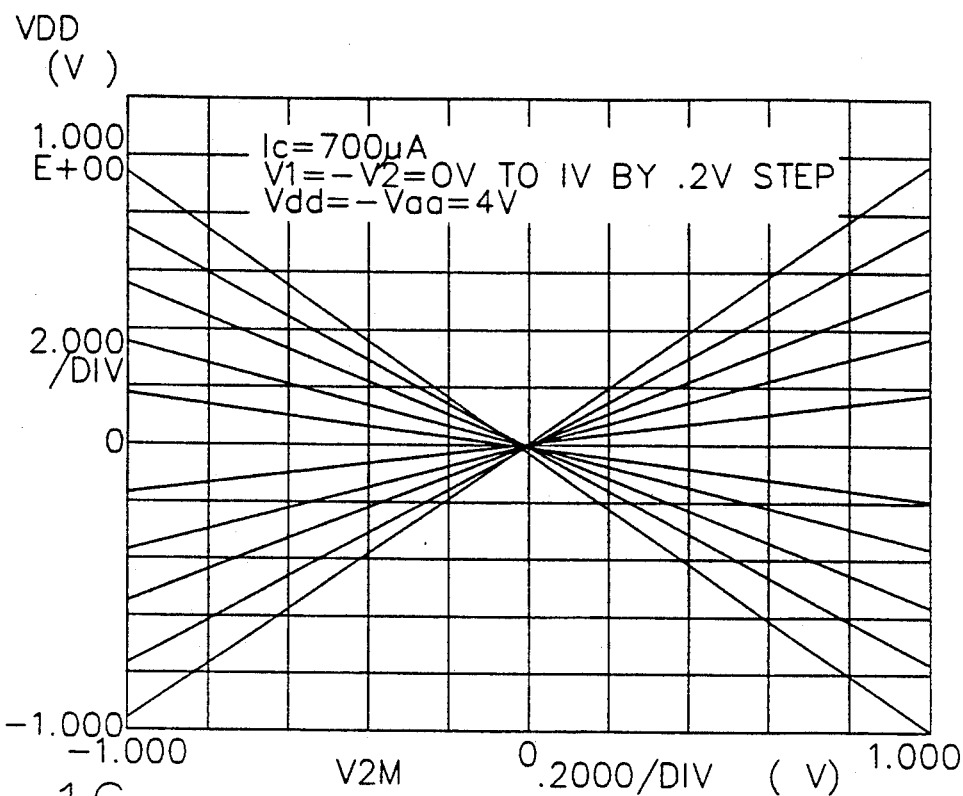
FIG. 16 is the measured DC transfer curves of the four quadrant multiplier of FIG. 3.

FIG. 16 shows the measured DC transfer curves of the multiplier in FIG. 3 with Ic=700 μA. The horizontal axis represents the input V1, and the vertical axis represents the differential output current. The output current was converted to output voltages by inserting a 600Ω resistor between each of the output terminals and the positive supply. The curves in FIG. 16 were obtained by sweeping V1 from −1 V to 1 V, while varying V2 from −1 V to 1 V in 0.2 V steps. The expression (11), and the measured results in FIG. 15 closely agree.

The multiplication function of the circuit in FIG. 3 was further tested by applying two cosine waves to the inputs. The signals $V_1=2.3$ Cos($2\pi f_1$)t and $V_2=0.35$ Cos($2\pi f_2$)t were applied to the circuit, where $f_1=29.1\times 10^3$ Hz and $f_2=1.12\times 10^6$ Hz. The expected output would be a Double Side Band-Suppressed Carrier (DSB-SC) signal. For 600Ω load resistors, the output voltage was computed to be:

$$V_{out} = (2)(600)KV1V2 = (2)(600)\frac{50\mu}{3\mu}(5)(10^{-5})\left(\frac{A}{V^2}\right)V1V2 \quad (16)$$
$$= V1V2 = (0.5)(.35)(2.3)\text{Cos}(2\pi f_1 t)\text{Cos}(2\pi f_2 t)$$
$$= 0.403[\text{Cos}2\pi(f_1+f_2)t + \text{Cos}2\pi(f_1-f_2)t]$$

Figure 17:
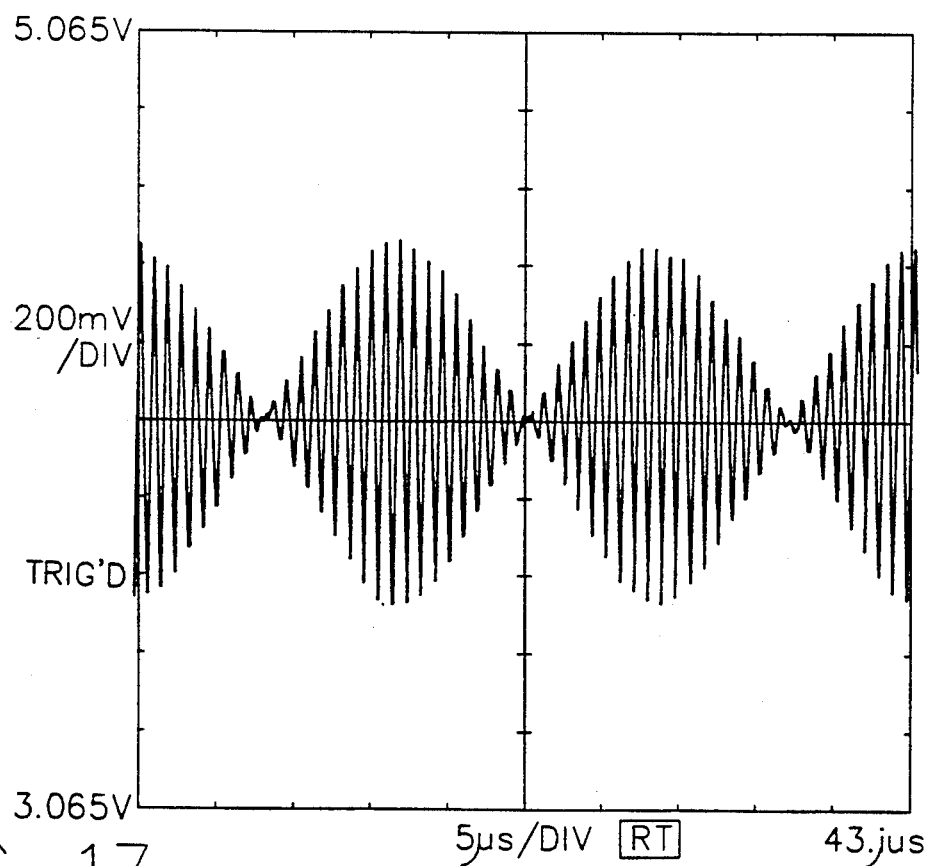
FIG. 17 is the measured multiplication of two cosine signals using the circuit of FIG. 3.

The measured multiplication result is shown in FIG. 17. The peak amplitude was 0.44 V, which closely agrees with the result in Equation (16) considering the tolerance of the 600Ω resistive loads on the chip.

High frequency performance of the multiplier was tested for frequencies up to 100 MHz. To reduce the effect of the parasitic poles in the measurement setup the multiplier was terminated with 50Ω resistive loads. The multiplier performed well in frequencies up to 50 MHz. Beyond 120 MHz the output was distorted, which is attributed to the reduced loop gain at high frequencies.

Figure 18:
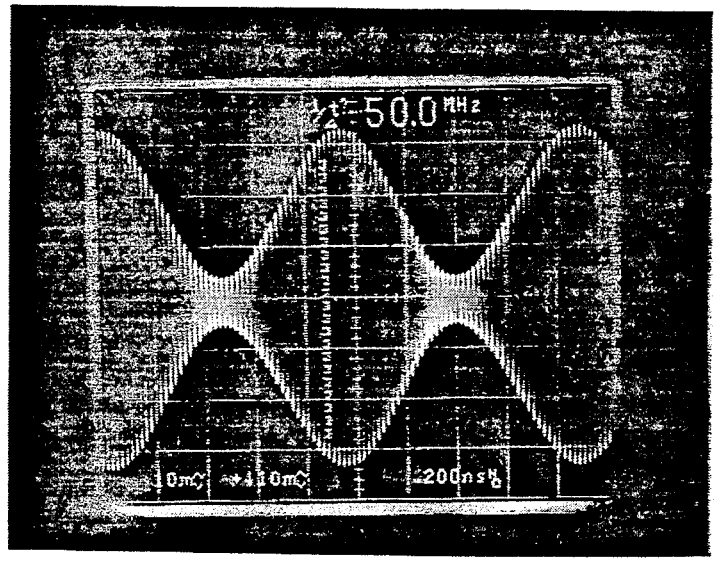
FIG. 18 is the measured multiplication of a 1 MHz cosine signal with a 50 MHz cosine signal, using the circuit of FIG. 3.

FIG. 18 shows the measured AM signal obtained by applying a 1 MHz cosine wave signal having a DC component (its value was equal to the peak amplitude of the 1 MHz cosine wave signal) to the V1 input terminal and a 50 MHz cosine wave signal to the V2 input terminal. The peak amplitudes of the cosine signals were the same as those used for the measurements in FIG. 17. The results in FIGS. 17-18 demonstrate that the multiplier of FIG. 3 has good linearity and performs well in frequencies up to 50 MHz. The main measured characteristics of this multiplier are provided in Table 2.

TABLE 2

| Main characteristics of the multiplier in FIG. 3 | |
| --- | --- |
| Parameters | Measurements |
| Percent nonlinearity (V1 = 0, V2 = 2V$_{p-p}$) | .7% |
| Percent nonlinearity (V2 = 0, V1 = 2V$_{p-p}$) | .7% |
| Max. Freq. of Operation | 50 MHz |
| Power Consumption | 34 mW |
| Power Supply | ±4 V |
| Silicon Area | .1 mm$^2$ |

One skilled in the art would readily appreciate that other devices incorporating a voltage to current converter according to the invention can be fabricated. The inventive voltage to current converter is suitable to develop a family of computational building blocks. The invention can also be incorporated in multiple input/output applications, which can be generated by using multiple converters in parallel, making them candidates for large order filtering applications and many high performance analog computations. Accordingly, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A voltage to current converter comprising:
   first, second, and third field effect transistors (FETs), the sources of which are electrically connected to define a common source node;
   first and second voltage inputs electrically connected to the gate of said first FET and the gate of said second FET, respectively;
   first and second current outputs electrically connected to the drain of said first FET and the drain of said second FET, respectively; and
   a feedback network, electrically connected between the drain of said third FET and the common source node for maintaining constant current through said third FET.

2. The voltage to current converter of claim 1 wherein said feedback network includes a first current mirror electrically connected to the common source node.

3. The voltage to current converter of claim 2 wherein said feedback network further includes a fourth FET arranged as a common drain follower, the gate of which is electrically connected to the drain of said third FET, and the source of which is electrically connected to said first current mirror.

4. The voltage to current converter of claim 3 further comprising a second current mirror and a current source, serially connected to the drain of said third FET.

5. The voltage to current converter of claim 4 wherein said first current mirror includes two bipolar transistors and wherein said second current mirror includes a fifth FET and a sixth FET.

6. The voltage to current converter of claim 5 wherein said two bipolar transistors of said first current mirror have common base and common emitter connections.

7. The voltage to current converter of claim 5 wherein said two FETs of said second current mirror have common gate and common source connections.

8. The voltage to current converter of claim 7 further comprising a first reference voltage electrically connected to the drain of said fourth FET, the source of said fifth FET, and the source of said sixth FET.

9. The voltage to current converter of claim 6 further comprising a second reference voltage electrically connected to said current source and the emitters of said two bipolar transistors.

10. The voltage to current converter of claim 1 electrically connected in parallel to a second voltage to current converter to form an analog four quadrant multiplier.

11. A voltage to current converter comprising:
   first, second, and third field effect transistors (FETs), the sources of which are electrically connected to define a common source node;
   first and second voltage inputs electrically connected to the gate of said first FET and the gate of said second FET, respectively;
   first and second current outputs electrically connected to the drain of said first FET and the drain of said second FET, respectively; and
   a feedback network, electrically connected between the drain of said third FET and the common source node for varying the voltage between the common source node and ground in response to changes in said first and second voltage inputs in order to maintain constant current through said third FET.

12. The voltage to current converter of claim 11 wherein said feedback network includes a first current mirror electrically connected to the common source node.

13. The voltage to current converter of claim 12 wherein said feedback network further includes a fourth FET arranged as a common drain follower, the gate of which is electrically connected to the drain of said third FET, and the source of which is electrically connected to said first current mirror.

14. The voltage to current converter of claim 13 further comprising a second current mirror and a current source, serially connected to the drain of said third FET.

15. The voltage to current converter of claim 14 wherein said first current mirror includes two bipolar transistors and wherein said second current mirror includes a fifth FET and a sixth FET.

16. The voltage to current converter of claim 15 wherein said two bipolar transistors of said first current mirror have common base and common emitter connections.

17. The voltage to current converter of claim 15 wherein said two FETs of said second current mirror have common gate and common source connections.

18. The voltage to current converter of claim 17 further comprising a first reference voltage electrically connected to the drain of said fourth FET, the source of said fifth FET, and the source of said sixth FET.

19. The voltage to current converter of claim 16 further comprising a second reference voltage electrically connected to said current source and the emitters of said two bipolar transistors.

20. The voltage to current converter of claim 11 electrically connected in parallel to a second voltage to current converter to form an analog four quadrant multiplier.

21. The voltage to current converter of claim 11 electrically connected in parallel to a second and third voltage to current converter to form an analog four quadrant multiplier.

22. A voltage to current converter comprising:
first, second, and third field effect transistors (FETs) the sources of which are electrically connected to define a common source node;
first and second voltage inputs electrically connected to the gate of said first FET and the gate of said second FET, respectively;
first and second current outputs electrically connected to the drain of said first FET and the drain of said second FET, respectively;
a fourth FET, the gate of which is electrically connected the drain of said third FET;
a first bipolar transistor, the collector of which is electrically connected to both the source of said fourth FET and the base of said first bipolar transistor;
a second bipolar transistor, the collector of which is electrically connected to said common source node, the base of which is electrically connected to the base of said first bipolar transistor, and the emitter of which is electrically connected to the emitter of said first bipolar transistor;
a fifth FET, the drain of which is electrically connected to the drain of said third FET;
a sixth FET, the drain of which is electrically connected to both the gate of said fifth FET and the gate of said sixth FET;
a current source which is electrically connected to the drain of said sixth FET;
a first reference voltage which is electrically connected to the drain of said fourth FET, the source of said fifth FET, and the source of said sixth FET; and
a second reference voltage electrically connected to said current source, the emitter of said first bipolar transistor, and the emitter of said second bipolar transistor.

23. The voltage to current converter of claim 22 wherein said current source is a constant current source.

24. The voltage to current converter of claim 22 wherein the gate of said third FET is electrically connected to a constant voltage source.

25. The voltage to current converter of claim 22 wherein said current source is a variable current source and the gate of said third FET is electrically connected to a variable voltage source.

26. A voltage to current converter comprising:
first and second field effect transistors (FETs), the sources of which are electrically connected to define a first common source node;
third and fourth FETs, the sources of which are electrically connected to define a second common source node;
a first voltage input electrically connected to the gate of said first FET and the gate of said third FET;
a second voltage input electrically connected to the gate of said second FET and the gate of said fourth FET;
first and second current outputs electrically connected to the drain of said third FET and the drain of said second FET, respectively;

a first feedback network electrically connected between the drain of said first FET and said first common source node for maintaining constant current through said first FET; and
a second feedback network electrically connected between the drain of said fourth FET and said second common source node for maintaining constant current through said fourth FET.

27. The voltage to current converter of claim 26 wherein said first and second feedback networks, vary the voltage between their respective common source nodes and ground in response to changes in said first and second voltage inputs in order to maintain constant current through said first and said fourth FETs, respectively.

28. The voltage to current converter of claim 27 wherein said first feedback network includes a first current mirror electrically connected to said first common source node and said second feedback network includes a second current mirror electrically connected to said second common source node.

29. The voltage to current converter of claim 28 wherein said first and second feedback networks further include a fifth and a sixth FET respectively arranged as common drain followers, the gates of which are electrically connected to the drains of said first and fourth FETs, respectively, and the sources of which are electrically connected to said first and second current mirrors, respectively.

30. The voltage to current converter of claim 29 further comprising a third current mirror and a current source, serially connected between the drains of said first and fourth FETs and a reference voltage.

31. The voltage to current converter of claim 28 wherein said first current mirror includes two bipolar transistors, said second current mirror includes two bipolar transistors, and wherein said third current mirror includes a seventh FET, an eighth FET, and a ninth FET.

32. A voltage to current converter comprising:
first and second field effect transistors (FETs), the sources of which are electrically connected to define a first common source node;
third and fourth FETs, the sources of which are electrically connected to define a second common source node;
a first voltage input electrically connected to the gate of said first FET and the gate of said third FET;
a second voltage input electrically connected to the gate of said second FET and the gate of said fourth FET;
first and second current outputs electrically connected to the drain of said third FET and the drain of said second FET, respectively;
a fifth FET arranged as a common drain follower, the gate of which is electrically connected to the drain of said first FET;
a first reference voltage which is electrically connected to the drain of said fifth FET;
a sixth FET arranged as a common drain follower, the gate of which is electrically connected to the drain of said fourth FET, and the drain of which is electrically connected to said first reference voltage;
a seventh FET the source of which is electrically connected to said first reference voltage, and the drain of which is electrically connected to the drain of said first FET;

a current source which is electrically connected to the gate of said seventh FET;

a second reference voltage which is electrically connected to said current source;

an eighth FET the source of which is electrically connected to said first reference voltage, the drain of which is electrically connected to said current source, and the gate of which is electrically connected to said current source;

a ninth FET the source of which is electrically connected to said first reference voltage, the drain of which is electrically connected to the drain of said fourth FET, and the gate of which is electrically connected to said current source;

a first bipolar transistor, the collector of which is electrically connected to both the source of said fifth FET and the base of said first bipolar transistor, and the emitter of which is electrically connected said second reference voltage;

a second bipolar transistor, the collector of which is electrically connected to said first common source node, the base of which is electrically connected to the base of said first bipolar transistor, and the emitter of which is electrically connected to said second reference voltage;

a third bipolar transistor, the collector of which is electrically connected to both the source of said sixth FET and the base of said third bipolar transistor, and the emitter of which is electrically connected said second reference voltage; and a fourth bipolar transistor, the collector of which is electrically connected to said second common source node, the base of which is electrically connected to the base of said third bipolar transistor, and the emitter of which is electrically connected to said second reference voltage.

* * * * *

UNITED STATES PATENT AND TRADEMARK OFFICE
CERTIFICATE OF CORRECTION

PATENT NO.    : 5,317,279
DATED         : May 31, 1994
INVENTOR(S)   : Zarabadi et al.

It is certified that error appears in the above-identified patent and that said Letters Patent is hereby corrected as shown below:

Column 7, line 11, "$IR_c$" should be --$R_c$--.

Column 9, line 14, "M4a" should be --M1a--.

Column 9, line 47, "Q2a" should be --Q1a--.

Signed and Sealed this

Twenty-seventh Day of September, 1994

Attest:

BRUCE LEHMAN

Attesting Officer    Commissioner of Patents and Trademarks